(12) United States Patent
Hsin et al.

(10) Patent No.: US 7,112,504 B2
(45) Date of Patent: Sep. 26, 2006

(54) METHOD OF FORMING METAL-INSULATOR-METAL (MIM) CAPACITORS AT COPPER PROCESS

(75) Inventors: Ping-Yi Hsin, Hsin-Chu (TW); Zan-Chun Wei, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 19 days.

(21) Appl. No.: 10/694,684

(22) Filed: Oct. 28, 2003

(65) Prior Publication Data

US 2005/0087838 A1   Apr. 28, 2005

(51) Int. Cl.
*H01L 21/8242* (2006.01)

(52) U.S. Cl. ............... 438/386; 438/243; 438/244; 438/253; 438/387; 438/396

(58) Field of Classification Search ......... 438/210, 438/239, 243, 244, 253, 386, 387, 396, FOR. 220, 438/FOR. 430
See application file for complete search history.

(56) References Cited

U.S. PATENT DOCUMENTS

| | | | |
|---|---|---|---|
| 6,329,234 B1 * | 12/2001 | Ma et al. ............... 438/210 |
| 6,346,454 B1 | 2/2002 | Sung et al. ............ 438/396 |
| 6,384,442 B1 | 5/2002 | Chen ..................... 257/298 |
| 6,495,874 B1 | 12/2002 | Kawamura et al. ..... 257/301 |
| 6,528,384 B1 | 3/2003 | Beckmann et al. ..... 438/386 |
| 6,589,862 B1 * | 7/2003 | Wang et al. ............ 438/622 |
| 6,593,185 B1 * | 7/2003 | Tsai et al. ............. 438/253 |
| 6,723,600 B1 * | 4/2004 | Wong et al. ........... 438/244 |
| 6,767,788 B1 * | 7/2004 | Kim ...................... 438/253 |
| 2003/0027385 A1 * | 2/2003 | Park et al. .............. 438/253 |
| 2004/0224474 A1 * | 11/2004 | Barth et al. ............ 438/396 |

\* cited by examiner

*Primary Examiner*—George Fourson
*Assistant Examiner*—Joannie Adelle Garcia (57) ABSTRACT

As shown in FIG. 10, using photoresist capacitance trench masking portion 43 as a mask, the exposed portions 70, 72 of the patterned capacitance dielectric layer 32' between the respective initial via openings 36, 38 and the capacitance trench masking portion 43, the underlying twice patterned ARC 18" and the underlying twice patterned oxide layer 16" are etched down to a depth substantially equal to the bottom of the capacitance trench 25 to form respective trench openings 56, 58 contiguous and continuous with respective final via openings 52, 54, in turn forming respective dual damascene openings 57, 59. Final via openings 52, 54 expose underlying portions 78 of metal structure 12 and bottom electrodes 30', 30". Capacitance trench 25 includes sidewalls 50 formed of remaining portions of capacitance dielectric layer 32".

22 Claims, 6 Drawing Sheets

METHOD OF FORMING METAL-INSULATOR-METAL (MIM) CAPACITORS AT COPPER PROCESS

BACKGROUND OF THE INVENTION

With conventional metal-insulator-metal (MIM) processes, there are poor planarization issues at the copper (Cu) area and low-dielectric constant (low-k) damage issues. A low-k damage and loss issue also occurs during ash for the polymer removal and photoresist strip.

U.S. Pat. No. 6,528,384 B2 to Beckmann et al. describes a method for manufacturing a trench capacitor.

U.S. Pat. No. 6,495,874 B1 to Kawamura et al. describes a semiconductor device and production process thereof.

U.S. Pat. No. 6,384,442 B1 to Chen describes a fabrication process for metal-insulator-metal capacitor with low gate resistance.

U.S. Pat. No. 6,346,454 B1 to Sung et al. describes a method of making dual damascene interconnect structure and metal electrode capacitor.

SUMMARY OF THE INVENTION

Accordingly, it is an object of one or more embodiments of the present invention to provide an improved method of forming MIM capacitors, and the MIM capacitors formed thereby.

Other objects will appear hereinafter.

It has now been discovered that the above and other objects of the present invention may be accomplished in the following manner. Specifically, a structure having a metal structure formed thereover is provided. A dielectric layer is formed over the metal structure and a top layer is formed over the dielectric layer. A capacitance trench is formed through the top layer and into the dielectric layer. Respective bottom electrodes are formed over the opposing side walls of the capacitance trench. A capacitance dielectric layer is formed over: the respective bottom electrodes: the bottom of the capacitance trench; and the remaining top layer. Respective opposing initial via openings are formed adjacent the capacitance trench. Respective trench openings are formed above, continuous and contiguous with the lower portions of the respective opposing initial via openings and exposing portions of the underlying metal structure to form respective opposing dual damascene openings. Planarized metal portions are formed within: the dual damascene openings; and the capacitance trench to form a top electrode.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Information Known to the Inventors—Not to be Considered Prior Art

The inventors have discovered that the reason for the poor planarization issues at the copper (Cu) area and low-dielectric constant (low-k) damage issues are because in the conventional MIM process, a high step height is formed which will make the lower via etching process window to both connect the top electrode and the metal layer.

In the present invention, the capacitance trench 25 and bottom electrodes 30', 30" therein are formed before the trench openings 56, 58 and final via openings 52, 54 are formed.

Figure 1:
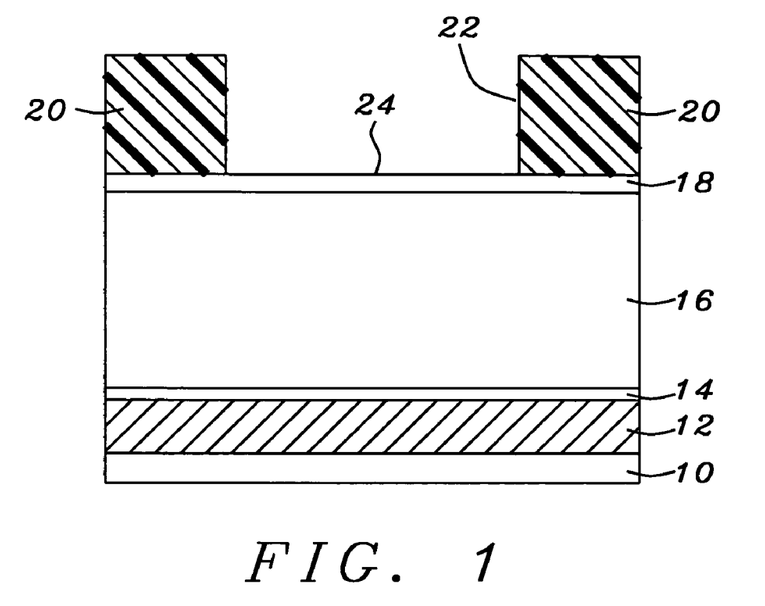
FIGS. 1 to 12 schematically illustrate a preferred embodiment of the present invention.

Initial Structure—FIG. 1

As shown in FIG. 1, structure 10 includes metal structure 12 formed thereover to a thickness of preferably from about 100 to 500 Å and more preferably from about 200 to 400 Å.

Structure 10 is preferably a silicon or germanium substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Metal structure 12 is preferably comprised of copper (Cu), aluminum (Al) or gold (Au) and is more preferably copper (Cu) as will be used for illustrative purposes hereafter. Metal structure 12 has a thickness of preferably from about 1000 to 9000 Å and more preferably from about 2000 to 8000 Å.

An etch stop layer 14 is formed over copper structure 12 to a thickness of preferably from about 300 to 900 Å and more preferably from about 400 to 600 Å. Etch stop layer 14 is preferably comprised of silicon nitride (SiN) or silicon carbide (SiC).

A dielectric layer 16 is formed over etch stop layer 14 to a thickness of preferably from about 2000 to 12,000 Å and more preferably from about 7000 to 9000 Å. Dielectric layer 16 is preferably a low-k material such as oxide, silicon oxide or FSG and is more preferably a low-k oxide material as will be used for illustrative purposes hereafter. For the purposes of this invention, low-k means a dielectric constant of less than about 3.0.

A top layer 18 is formed over oxide layer 16 to a thickness of preferably from about 300 to 1500 Å and more preferably from about 1000 to 14,000 Å. Top layer 18 is preferably an anti-reflective coating (ARC) 18 (as will be used for illustrative purposes hereafter) comprised of silicon oxynitride (SiON).

A first patterned masking layer 20 is formed over ARC 18 and includes opening 22 exposing a portion 24 of ARC 18. First patterned masking layer 20 is preferably comprised of photoresist as will be used for illustrative purposes hereafter.

Figure 2:
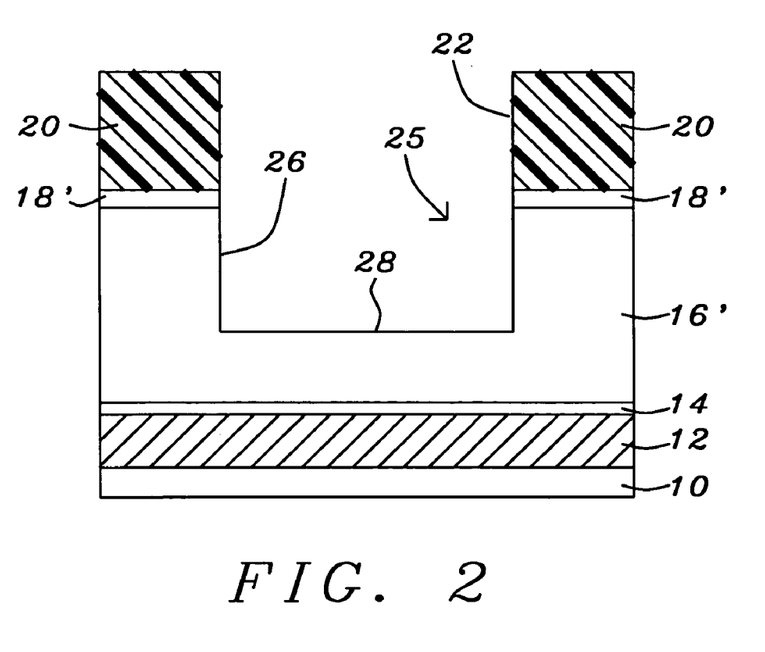

Formation of Capacitance Trench 25—FIG. 2

As shown in FIG. 2, using first patterned photoresist layer 20 as a mask, the exposed portion 24 of ARC 18 and a portion of the underlying oxide layer 16 are removed to define a capacitance trench 25 having side walls 26 and a bottom 28. The exposed portion 24 of ARC 18 and the portion of oxide layer 16 are removed preferably using an oxide etch process. It is noted that an etch stop layer (not shown) may be formed within oxide layer 16 to which the oxide etch process etches down to in defining the capacitance trench 25.

Capacitance trench 25 has a width of preferably from about 0.10 to 1.00 μm and more preferably from about 0.20 to 0.40 μm and has a depth of preferably from about 1000 to 9000 Å and more preferably from about 2000 to 6000 Å.

Figure 3:
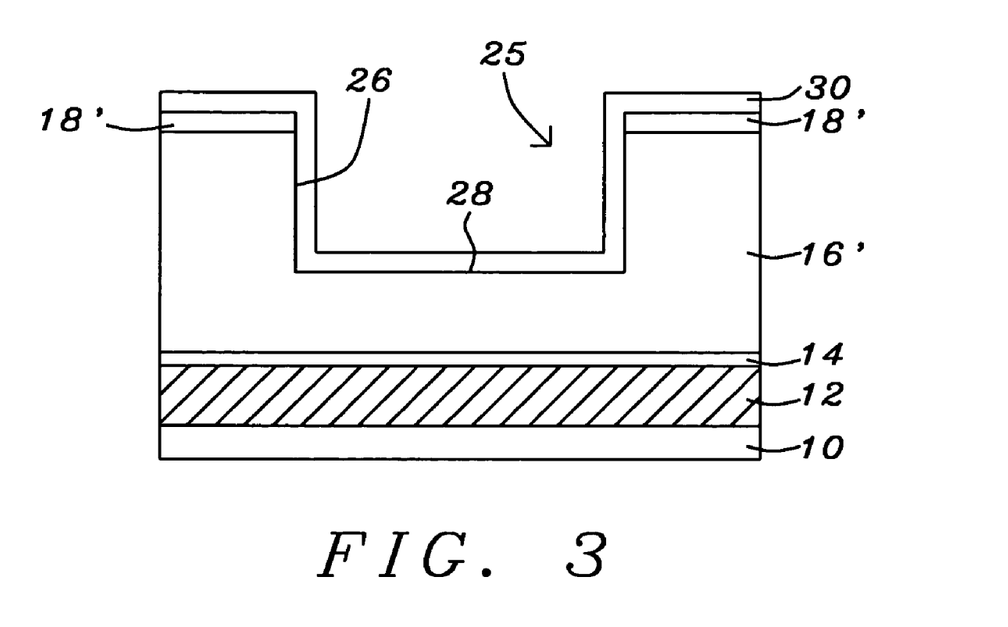

Formation of Bottom Electrode Layer 30—FIG. 3

As shown in FIG. 3, the first patterned masking layer 20 is removed from the structure of FIG. 2 and the structure is cleaned as necessary.

Then a bottom electrode layer 30 is formed over the patterned oxide layer 16' the capacitance trench side walls 26 and the capacitance trench bottom 28 to a thickness of preferably from about 100 to 500 Å and more preferably from about 200 to 400 Å. Bottom electrode layer 30 is preferably comprised of TaN or TiN and is more preferably TaN.

Figure 4:
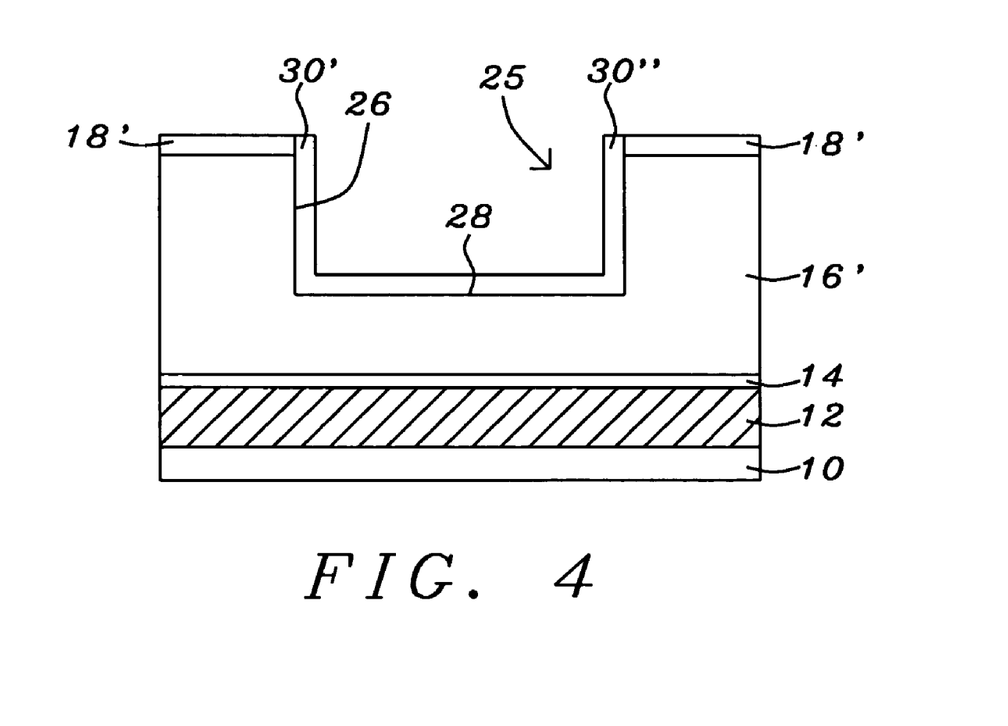

Anisotropic Etching of Bottom Electrode Layer 30 to Form Bottom Electrodes 30' 30"—FIG. 4

As shown in FIG. 4, an anisotropic etch is performed to remove the horizontal portions of the bottom electrode layer 30 and forming respective bottom electrodes 30', 30" over the opposing side walls 26 of the capacitance trench 25 leaving exposed a smaller portion of the bottom 28 of the capacitance trench.

Figure 5:
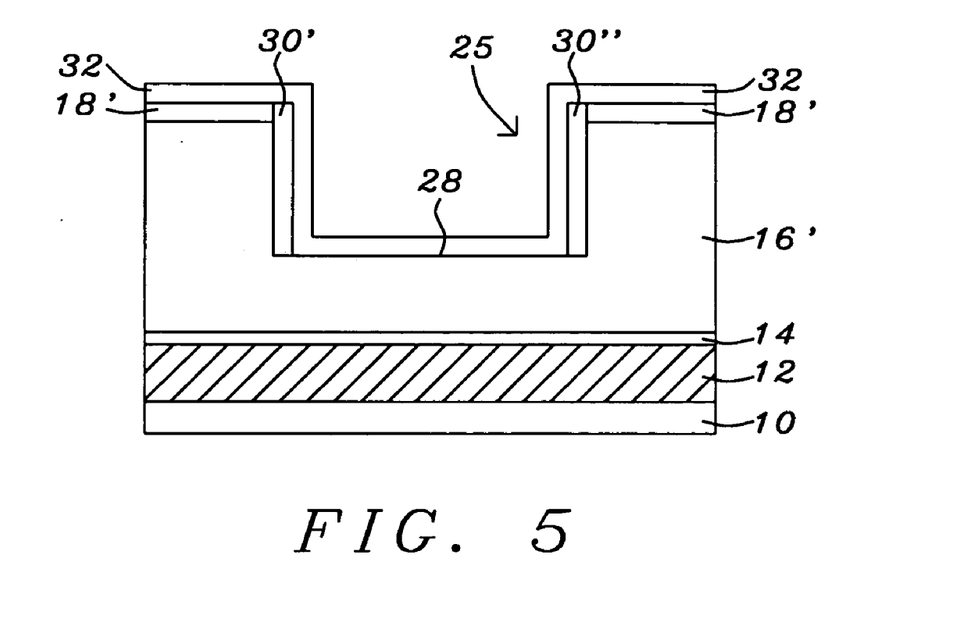

Formation of Capacitance Dielectric Layer 32—FIG. 5

As shown in FIG. 5, a capacitance dielectric layer 32 is formed over the patterned oxide layer 16, the bottom electrodes 30', 30" and the bottom 28 of the capacitance trench 25 to a thickness of preferably from about 100 to 600 Å and more preferably from about 250 to 350 Å. Capacitance dielectric layer 32 is preferably comprised of oxide or silicon oxide and is more preferably oxide.

Figure 6:
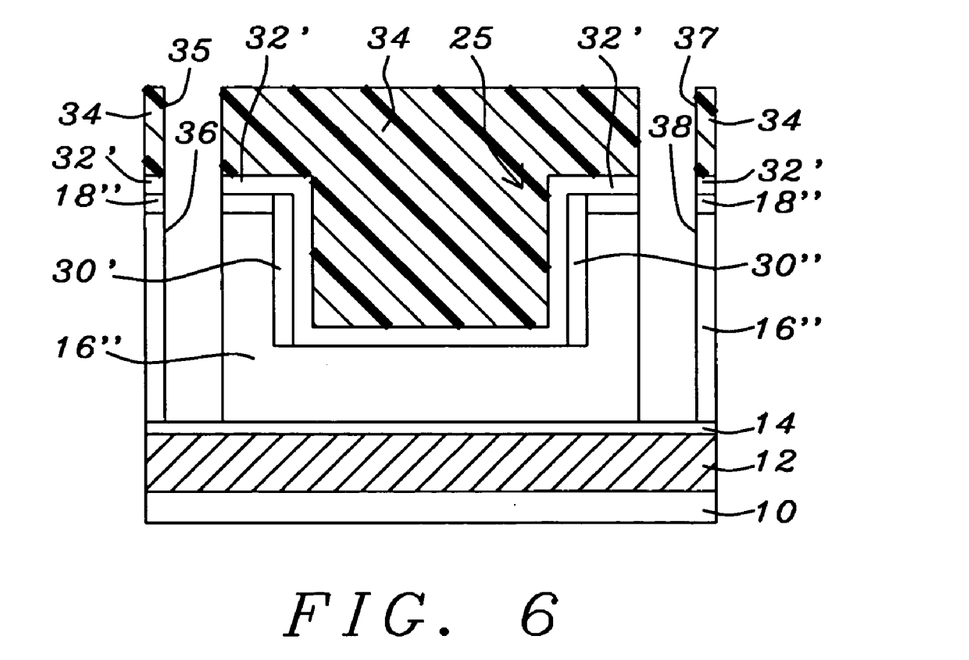

Formation of Initial Via Openings 36, 38—FIG. 6

As shown in FIG. 6, a second patterned masking layer 34 is formed over the structure of FIG. 5. Second patterned masking layer 34 includes openings 35, 37 exposing respective opposing portions of the capacitance dielectric layer 32 proximate the capacitance trench 25. Second patterned masking layer 34 is preferably comprised of photoresist as will be used for illustrative purposes hereafter.

Using second patterned photoresist layer 34 as a mask, the portions of the capacitance dielectric layer 32 exposed by the second patterned photoresist layer openings 35, 37, the underlying portions of the patterned ARC 18' and the underlying portions of the patterned oxide layer 16' down to the underlying etch stop layer 14 are removed to form respective initial via openings 36, 38. Initial via openings 36, 38 each have a width of preferably from about 0.10 to 0.50 µm and more preferably from about 0.15 to 1.46 µm.

Figure 7:
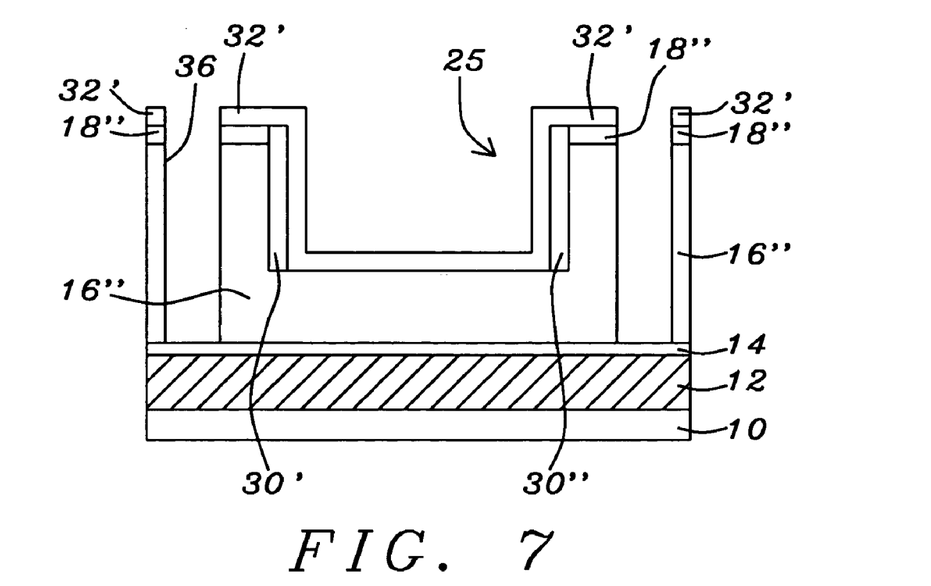

Removal of Second Patterned Photoresist Layer 34—FIG. 7

As shown in FIG. 7, second patterned photoresist layer 34 is removed and the structure is cleaned as necessary.

Figure 8:
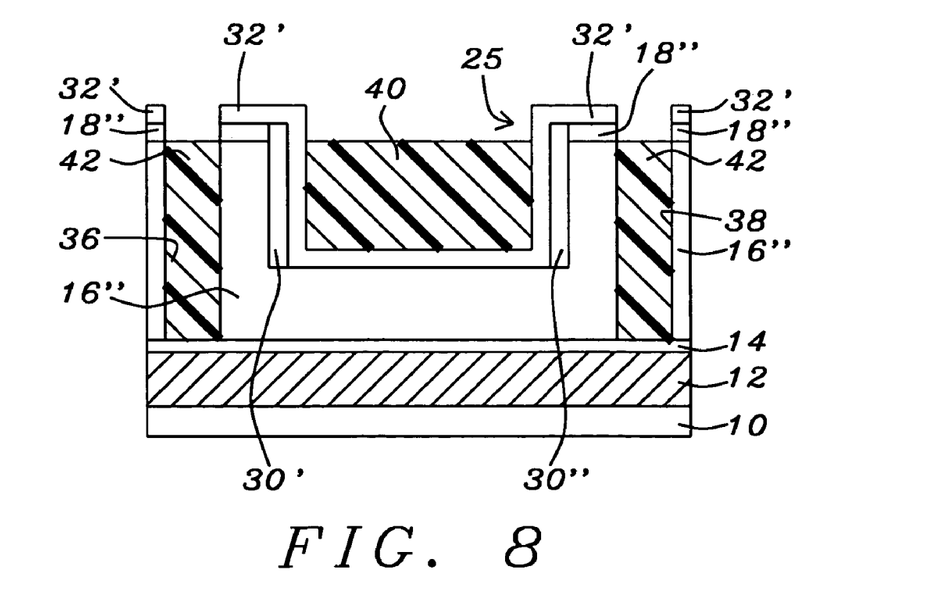

Formation of Etched-Back Third Masking Layer Portions 40, 42—FIG. 8

As shown in FIG. 8, a third masking layer is formed over the structure of FIG. 7, filling the initial via openings 36, 38 and the capacitance dielectric layer lined capacitance trench 25, and the third masking layer is then etched back to leave portions 42 within respective initial via openings 36, 38 and portion 40 within the capacitance dielectric layer lined capacitance trench 25. Third patterned masking layer portions 40, 42 are preferably comprised of photoresist, as will be used for illustrative purposes hereafter.

Figure 9:
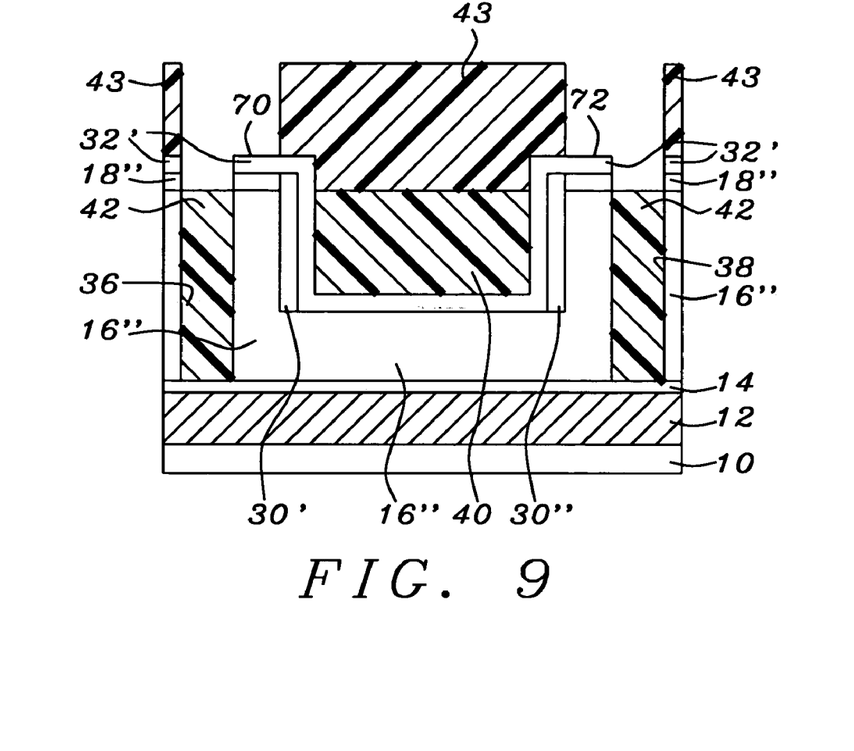

Formation of Capacitance Trench Masking Portion 43—FIG. 9

As shown in FIG. 9, a capacitance trench masking portion 43 is formed over the third patterned photoresist portion 40 within the capacitance dielectric layer lined capacitance trench 25, over portions of the patterned capacitance dielectric layer 32' adjacent the capacitance trench 25 above the respective bottom electrodes 30', 30" and over portions of the patterned capacitance dielectric layer 32' outboard of respective initial via openings 36, 38.

This leaves exposed portions 70, 72 of the patterned capacitance dielectric layer 32' between the respective initial via openings 36, 38 and the capacitance trench masking portion 43.

Capacitance trench masking portion 43 is preferably comprised of photoresist as will be used for illustrative purposes hereafter.

Figure 10:
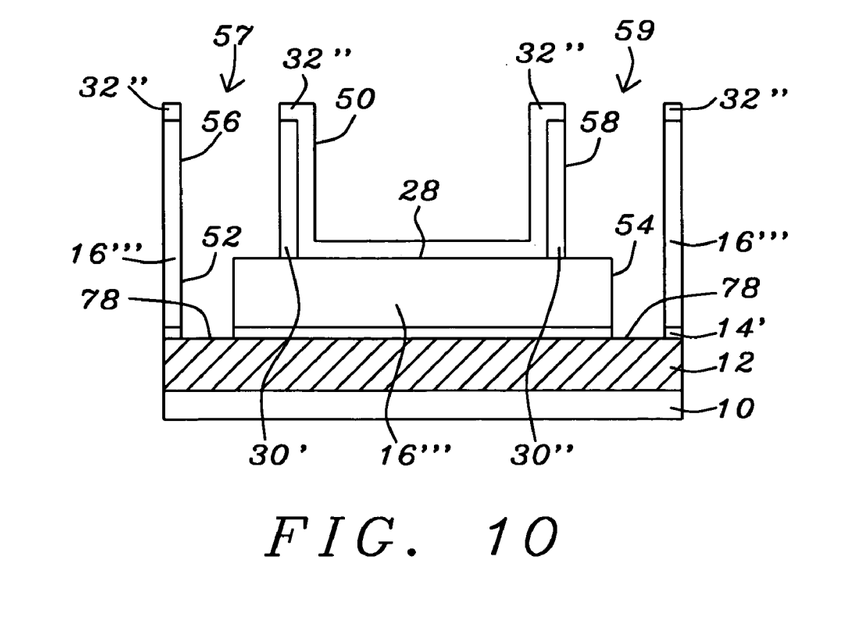

Formation of Trench Openings 56, 58—FIG. 10

As shown in FIG. 10, using photoresist capacitance trench masking portion 43 as a mask, the exposed portions 70, 72 of the patterned capacitance dielectric layer 32' between the respective initial via openings 36, 38 and the capacitance trench masking portion 43, the underlying twice patterned ARC 18" and the underlying twice patterned oxide layer 16" down to a depth substantially equal to the bottom of the capacitance trench 25 to form respective trench openings 56, 58 contiguous and continuous with respective final via openings 52, 54, in turn forming respective dual damascene openings 57, 59. Final via openings 52, 54 expose underlying portions 78 of metal structure 12.

Figure 11:
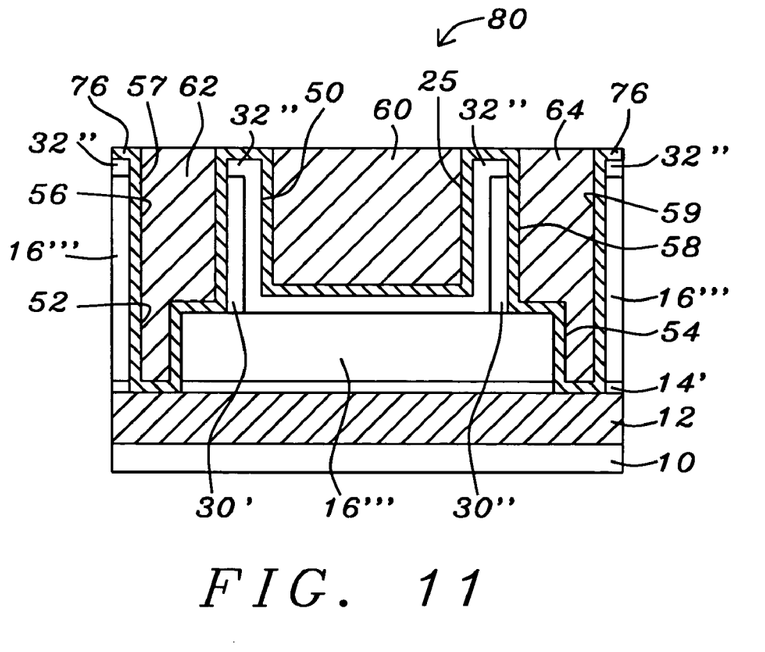

Formation of Barrier Layer 76 and Planarized Metal Portions 60, 62, 64—FIG. 11

As shown in FIG. 11, a barrier layer 76 is formed over the structure of FIG. 10, lining the respective dual damascene openings 57, 59 and the capacitance dielectric layer lined capacitance trench 25 to a thickness of preferably from about 100 to 400 Å and more preferably from about 250 to 350 Å.

Barrier layer 76 is preferably comprised of TaN or TiN.

A metal layer is formed over the structure, at least filling the barrier layer 76 lined respective dual damascene openings 57, 59 and capacitance trench 25 and is then planarized to remove the excess of the metal layer overlying the barrier layer 76 lined respective dual damascene openings 57, 59 and capacitance trench 25 to form: respective planarized metal portions 62, 64 within respective dual damascene openings 57, 59; and top electrode portion 60 within capacitance trench 25 to complete formation of MIM capacitor 80.

The planarized metal portions 62, 64 and the top electrode portion 60 are preferably comprised of copper, aluminum or gold and are more preferably copper.

Figure 12:
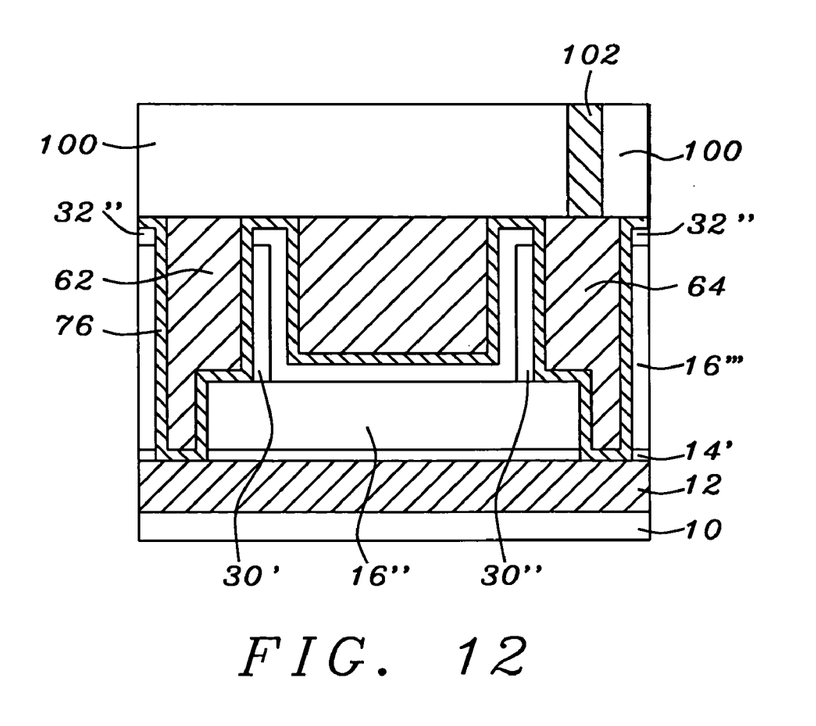

Further processing may then proceed. For example, as shown in FIG. 12, an inter-metal dielectric layer (IMD) 100 may be formed over the MIM capacitor 80 and a contact 102 may be formed through the IMD layer 100 to contact the MIM capacitor 80 at planarized metal portion 64.

It is noted that the method of the present invention changes the capacitor layout from horizontal to vertical at the copper (Cu) chemical mechanical process (CMP).

Advantages of the Prestent Invention

The advantages of one or more embodiments of the present invention include:

1. less planarization than previous processes for extra layer added, i.e. need extra mask photo like alignment mark open;
2. less low-k damage for low-k oxide layer 16 thickness loss during ashing and k-loss;
3. Less MIM capacity than in conventional designs for the MIM is changed from horizontal to vertical;

4. No extra MIM define step like current, i.e. conventional MIM needs to add another mask to define the top electrode;
5. Reduced leakage problem due to etching polymer issue for polymer induce metal (top) and metal (bottom electrode); and
6. Lower cost by saving alignment mark (AM) etching and less masking.

While particular embodiments of the present invention have been illustrated and described, it is not intended to limit the invention, except as defined by the following claims.

We claim:

1. A method of forming a MIM capacitor, comprising the steps of:
   forming a capacitance trench within a dielectric layer formed over a substrate; the capacitance trench having opposing side walls and a bottom;
   forming respective bottom electrodes along the opposing side walls;
   forming a capacitance dielectric layer along the respective bottom electrodes;
   forming at least one dual damascene opening directly adjacent and thereby exposing an associated one of the bottom electrodes; and
   depositing metal a) in the at least one dual damascene opening such that the metal laterally contacts the associated bottom electrode directly and b) filling the capacitance trench; and
   planarizing to form planarized metal portions within the at least one dual damascene opening and the capacitance trench, the metal portions within the capacitance trench forming a top electrode of the MIM capacitor.

2. The method of claim 1, further comprising forming the dielectric layer over an underlying metal structure and forming a top layer over the dielectric layer prior to said forming a capacitance trench, and wherein
   the capacitance trench is formed to extend through the top layer,
   the capacitance dielectric layer is further formed along the bottom of the capacitance trench and remaining portions of the top layer,
   forming at least one dual damascene opening comprises forming initial via openings adjacent the capacitance trench then forming respective trench openings above, continuous and contiguous with lower portions of the respective via openings to form respective opposing ones of said at least one dual damascene opening and,
   each said dual damascene opening exposes portions of the metal structure.

3. The method of claim 2, wherein the metal structure is comprised of copper, aluminum or gold; the dielectric layer is comprised of an oxide material having a dielectric constant of less than about 3.0, silicon oxide or FSG; the top layer is comprised of silicon oxynitride; the bottom electrodes are comprised of TaN or TiN; the capacitance dielectric layer is comprised of oxide or silicon oxide; and the planarized metal portions are comprised of copper, aluminum or gold.

4. The method of claim 2, wherein the metal structure is comprised of copper; the dielectric layer is comprised of an oxide material having a dielectric constant of less than about 3.0; the top layer is comprised of silicon oxynitride; the bottom electrodes are comprised of TaN or TiN; the capacitance dielectric layer is comprised of oxide; and the planarized metal portions are comprised of copper.

5. The method of claim 2, wherein the metal structure has a thickness of from about 1000 to 9000 Å; the dielectric layer has a thickness of from about 2000 to 12,000 Å; the top layer has a thickness of from about 300 to 1500 Å; the bottom electrodes have a thickness of from about 100 to 500 Å; and the capacitance dielectric layer has a thickness of from about 100 to 600 Å.

6. The method of claim 2, wherein the metal structure has a thickness of from about 2000 to 8000 Å; the dielectric layer has a thickness of from about 7000 to 9000 Å; the top layer has a thickness of from about 1000 to 14,000 Å the bottom electrodes have a thickness of from about 200 to 400 Å; and the capacitance dielectric layer has a thickness of from about 250 to 350 Å.

7. The method of claim 2, further including the step of forming an etch stop layer between the metal structure and the dielectric layer.

8. The method of claim 1, further including the step of forming an etch stop layer between the metal structure and the dielectric layer; the etch stop layer being comprised or silicon nitride or silicon carbide and having a thickness of from about 300 to 900 Å.

9. The method of claim 1, further including the step of forming an etch stop layer between the metal structure and the dielectric layer; the etch stop layer comprised of silicon nitride or silicon carbide and having a thickness of about 400 to 600 Å.

10. The method of claim 2, wherein the initial via openings expose portions of the metal structure.

11. The method of claim 1, further including a top metal process.

12. The method of claim 1, wherein the substrate is a silicon substrate, a germanium substrate, a semiconductor wafer or a semiconductor substrate.

13. A method of forming a MIM capacitor, comprising the sequential steps of:
   providing a structure having a metal structure formed thereover; the metal structure being comprised of copper, aluminum or gold;
   forming a dielectric layer over the metal structure; the dielectric layer being comprised of an oxide material having a dielectric constant of less than about 3.0, such as silicon oxide or FSG;
   forming a top layer over the dielectric layer; the top layer being comprised of silicon oxynitride;
   forming a capacitance trench through the top layer and into the dielectric layer;
   the capacitance trench have opposing side walls and a bottom;
   forming respective bottom electrodes over the capacitance trench opposing side walls; the bottom electrodes being comprised of TaN or TiN;
   forming a capacitance dielectric layer over the respective bottom electrodes, the bottom of the capacitance trench; and remaining portions of the top layer; the capacitance dielectric layer being comprised of oxide or silicon oxide;
   forming respective opposing initial via openings adjacent the capacitance trench;
   forming respective trench openings above, continuous and contiguous with lower portions of the respective opposing initial via openings and exposing portions of the metal structure and the respective bottom electrodes to form respective opposing dual damascene openings; and
   forming planarized metal portions within the dual damascene openings and the capacitance trench to form a top electrode, the planarized metal portions being comprised of copper, aluminum or gold; to complete formation of the MIM capacitor.

14. The method of claim 13, wherein the structure is a silicon substrate, a germanium substrate, a semiconductor wafer or a semiconductor substrate.

15. The method of claim 13, wherein the metal structure is comprised of copper; the dielectric layer is comprised of an oxide material having a dielectric constant of less than about 3.0; the top layer is comprised of silicon oxynitride; the bottom electrodes are comprised of TaN or TiN; the capacitance, dielectric layer is comprised of oxide; and the planarized metal portions are comprised of copper.

16. The method of claim 13, wherein the metal structure has a thickness of from about 1000 to 9000 Å; the dielectric layer has a thickness of from about 2000 to 12,000 Å;
the top layer has a thickness of from about 300 to 1500 Å; the bottom electrodes have a thickness of about 100 to 500 Å; and the capacitance dielectric layer has a thickness of from about 100 to 600 Å.

17. The method of claim 13, wherein the metal structure has a thickness of from about 2000 to 8000 Å; the dielectric layer has a thickness of from about 7000 to 9000 Å; the top layer has a thickness of from about 1000 to 14,000 Å; the bottom electrodes have a thickness of from about 200 to 400 Å; and the capacitance dielectric layer has a thickness of from about 250 to 350 Å.

18. The method of claim 13, including the step of forming an etch stop layer between the metal structure and the dielectric layer.

19. The method of claim 13, including the step of forming an etch stop layer between the metal structure and the dielectric layer; the etch stop layer being comprised of silicon nitride or silicon carbide and having a thickness of from about 300 to 900 Å.

20. The method of claim 13, including the step of forming an etch stop layer between the metal structure and the dielectric layer; the etch stop layer being comprised of silicon nitride or silicon carbide and having a thickness of from about 400 to 600 Å.

21. The method of claim 13, wherein the initial via openings expose portions of the metal structure.

22. The method of claim 13, further including a top metal process.

* * * * *

UNITED STATES PATENT AND TRADEMARK OFFICE
CERTIFICATE OF CORRECTION

| | | |
|---|---|---|
| PATENT NO. | : 7,112,504 B2 | Page 1 of 1 |
| APPLICATION NO. | : 10/694684 | |
| DATED | : September 26, 2006 | |
| INVENTOR(S) | : Ping-Yi Hsin and Zin Chein Wei | |

It is certified that error appears in the above-identified patent and that said Letters Patent is hereby corrected as shown below:

On Title Page

Item (75) Inventors: delete "Zan Chun Wei" and insert therefore -- Zin Chein Wei --.

Item (57) ABSTRACT delete entire abstract and insert:

-- A method of forming a MIM capacitor, and the resultant MIM capacitor, comprising the following steps. A structure having a metal structure formed thereover is provided. A dielectric layer is formed over the metal structure and a top layer is formed over the dielectric layer. A capacitance trench is formed through the top layer and into the dielectric layer. Respective bottom electrodes are formed over the opposing side walls of the capacitance trench. A capacitance dielectric layer is formed over: the respective bottom electrodes: the bottom of the capacitance trench; and the remaining top layer. Respective opposing initial via openings are formed adjacent the capacitance trench. Respective trench openings are formed above, continuous and contiguous with the lower portions of the respective opposing initial via openings and exposing portions of the underlying metal structure to form respective opposing dual damascene openings. Planarized metal portions are formed within: the dual damascene openings; and the capacitance trench to form a top electrode. --

Column 4, Line 19, after "16" insert -- are etched --.

Column 4, line 25, after "12" insert -- and bottom electrodes 30', 30". Capacitance trench 25 includes sidewalls 50 formed of remaining portions of capacitance dielectric layer 32". --

Column 4, line 57, delete "Prestent" and insert therefore -- Present --.

Signed and Sealed this

Seventh Day of August, 2007

JON W. DUDAS
*Director of the United States Patent and Trademark Office*